(12) United States Patent
Payne

(10) Patent No.: US 8,604,838 B2
(45) Date of Patent: Dec. 10, 2013

(54) COMPARATOR WITH IMPROVED TIME CONSTANT

(75) Inventor: Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/323,540

(22) Filed: Dec. 12, 2011

(65) Prior Publication Data

US 2013/0147520 A1    Jun. 13, 2013

(51) Int. Cl.
*H03K 5/22*    (2006.01)

(52) U.S. Cl.
USPC ............... 327/65; 327/51; 327/52; 327/54; 327/55; 327/56; 327/63; 327/64; 327/67; 327/68; 327/69

(58) Field of Classification Search
USPC ........... 327/51, 52, 54, 55, 56, 57, 63, 64, 65, 327/67, 68, 69
See application file for complete search history.

(56) References Cited

U.S. PATENT DOCUMENTS

| | | | |
|---|---|---|---|
| 4,274,013 A | 6/1981 | Clemons et al. | |
| 4,559,522 A | 12/1985 | Sekino et al. | |
| 4,604,533 A | 8/1986 | Miyamoto et al. | |
| 5,510,734 A | 4/1996 | Sone | |
| 5,627,789 A | 5/1997 | Kalb, Jr. | |
| 5,901,088 A | 5/1999 | Kraus | |
| 6,060,912 A | 5/2000 | Opris et al. | |
| 6,252,430 B1 | 6/2001 | van der Wagt et al. | |
| 6,366,140 B1 | 4/2002 | Warwar | |
| 6,480,037 B1 * | 11/2002 | Song et al. | 327/55 |
| 6,597,303 B2 | 7/2003 | Cosand | |
| 6,788,103 B1 | 9/2004 | Feldman et al. | |
| 6,862,208 B2 * | 3/2005 | Palmer et al. | 365/154 |
| 7,218,258 B2 * | 5/2007 | Delanghe et al. | 341/118 |
| 7,688,125 B2 | 3/2010 | Payne | |
| 8,258,819 B2 * | 9/2012 | Tripathi et al. | 327/94 |
| 2007/0236258 A1 * | 10/2007 | Kiziloglu et al. | 327/55 |

(Continued)

FOREIGN PATENT DOCUMENTS

JP    03145330    6/1991

OTHER PUBLICATIONS

"A 4mW 3-tap 10 Gb/s Decision Feedback Equalizer," 2011 IEEE 54th International Midwest Symposium on Circuits and Systems (MWSCAS), Sep. 23, 2011, pp. 1-4 (Payandehnia, et al.).

(Continued)

*Primary Examiner* — Nguyen Tran
*Assistant Examiner* — Afework Demisse
(74) *Attorney, Agent, or Firm* — Alan A. R. Cooper; W. James Brady, III; Frederick J. Telecky, Jr.

(57) ABSTRACT

An apparatus for comparing differential input signal inputs is provided. The apparatus comprises a CMOS sense amplifier (which has having a first input terminal, a second input terminal, a first output terminal, and a second output terminal), a first output circuit (which has a first load capacitance), a second output circuit (which has a second load capacitance), and an isolation circuit. The isolation circuit is coupled between the first output terminal of the CMOS sense amplifier and the first output circuit and is coupled between the second output terminal of the CMOS sense amplifier and the second output terminal of the CMOS sense amplifier. The isolation circuit isolates the first and second load capacitances from the CMOS sense amplifier.

17 Claims, 3 Drawing Sheets

(56) References Cited

U.S. PATENT DOCUMENTS

2012/0257103 A1* 10/2012 Lavoie et al. .............. 348/441
2013/0002301 A1* 1/2013 Gondi et al. ................ 326/83
2013/0009800 A1* 1/2013 Yang et al. ................. 341/155

OTHER PUBLICATIONS

PCT Search Report mailed Oct. 31, 2008 (from U.S. Appl. No. 11/957,640).

U.S. Appl. No. 11/957,640, filed Jul. 24, 2008.

* cited by examiner

US 8,604,838 B2

1

COMPARATOR WITH IMPROVED TIME CONSTANT

TECHNICAL FIELD

The invention relates generally to a comparator and, more particularly, to a sense amplifier based comparator.

BACKGROUND

Comparators are non-linear circuits that are generally used to detect the sign differences between two or more signals and have been used to resolve signals in a variety of applications, such as memory and analog-to-digital converters (ADCs). As an example, a sense amplifier 50 (which can, for example, function as a comparator for memory applications) is shown in FIG. 1. Specifically, this sense amplifier 50 is a CMOS circuit that functions as a regenerative, clocked comparator. It generally comprises cross-coupled PMOS and NMOS transistors Q2 to Q5, a differential input pair of NMOS transistors Q7 and Q8, and a clock circuit (which generally includes PMOS transistors Q1 and Q6 and NMOS transistor Q9). When the clock signal CLK is logic low or "0," output terminals R and S can be precharged to the voltage on supply rail VDD and, when the clock signal CLK is logic high or "1," the output values at terminals R and S are resolved based on the input values at input terminals INM and INP. If the voltage on input terminal INP is greater than the voltage on terminal INM, the terminals S and R resolve as "1" and "0," respectively, and, conversely, when voltage on input terminal on INP is less than the voltage on terminal INM, the terminals S and R resolve as "0" and "1," respectively. Additionally, transistor Q9 couples and decouples the differential pair Q7 and Q8 to ground (supply rail) based on the clock signal CLK.

A property used to describe the behavior of the sense amplifier 50 is its "time constant," which indicates dependency of the propagation delay (or "clock to Q delay") on the amplitude of the inputs. Typically, with a smaller the magnitude in the difference in voltage between terminals INM and INP, there is a longer delay to resolve the values on terminals R and S. This relationship between can be expressed as follows:

$$T_{PROP} = \max(t_{FIXED}, t_{FIXED} - \tau * \ln(|V_{IN}|)), \quad (1)$$

where $T_{PROP}$ is the propagation delay, $t_{FIXED}$ is a fixed comparator delay related to (for example) process variation, temperature, and voltage on supply rail VDD, $\tau$ is a time constant, and $|V_{IN}|$ is the magnitude of the difference in voltage between terminals INM and INP (which is typically a differential signal). Usually, equation (1) holds for signals on the order of 100 mV or less, and, once the difference is sufficiently large, the propagation delay $T_{PROP}$ saturates to the fixed comparator delay $t_{FIXED}$. Thus, for some applications, it is desirable to reduce this propagation delay $T_{PROP}$ to more quickly resolve comparison results for low amplitude signals.

Some examples of conventional systems are: U.S. Pat. Nos. 4,274,013; 4,604,533; 5,627,789; 5,901,088; 7,688,125; and Payandehnia et al., "A 4 mW 3-tap 10 Gb/s Decision Feedback Equalizer," 2011 IEEE 54th International Midwest Symposium on Circuits and Systems (MWSCAS), Sep. 23, 2011, pp. 1-4.

SUMMARY

An embodiment of the present invention, accordingly, provides an apparatus. The apparatus comprises a CMOS sense amplifier having a first input terminal, a second input terminal, a first output terminal, and a second output terminal; a first output circuit having a first load capacitance; a second output circuit having a second load capacitance; and an isolation circuit that is coupled between the first output terminal of the CMOS sense amplifier and the first output circuit and that is coupled between the second output terminal of the CMOS sense amplifier and the second output terminal of the CMOS sense amplifier, wherein the isolation circuit isolates the first and second load capacitances from the CMOS sense amplifier.

In accordance with an embodiment of the present invention, the first and second output circuits further comprise first and second inverters, respectively.

In accordance with an embodiment of the present invention, the CMOS sense amplifier is controlled by a clock signal, and wherein the isolation circuit further comprises: a precharge circuit that is coupled to the first and second inverters and that is controlled by the clock signal; and a first isolation element that is coupled between the first output terminal of the CMOS sense amplifier and the first inverter; and a second isolation element that is coupled between the second output terminal of the CMOS sense amplifier and the second inverter.

In accordance with an embodiment of the present invention, the precharge circuit further comprises: a first MOS transistor that is coupled to the first inverter at its drain; and a second MOS transistor that is coupled to the second inverter at its drain.

In accordance with an embodiment of the present invention, the first and second isolation elements further comprise first and second resistors, respectively.

In accordance with an embodiment of the present invention, the clock signal further comprises a first clock signal, and wherein the first and second isolation elements further comprise first and second switches, respectively, that are controlled by a second clock signal, and wherein there is a non-overlapping period between activation of the CMOS sense amplifier by the clock signal and activation of the first and second switches by the second clock signal.

In accordance with an embodiment of the present invention, the sense amplifier further comprises: a clocking circuit that is configured to receive the first clock signal; a differential input pair of transistors that is configured to receive an differential input signal; a first pair of cross-coupled transistors that is coupled to the differential input pair of transistors; and a second pair of cross-coupled transistors that is coupled to the first pair of cross-coupled transistors.

In accordance with an embodiment of the present invention, an apparatus is provided. The apparatus comprises: an analog front end (AFE); an analog-to-digital converter (ADC) that is coupled to the AFE, wherein the AFE has a plurality of slicers, and wherein each slicer includes: a CMOS sense amplifier having a first input terminal, a second input terminal, a first output terminal, and a second output terminal; a first output circuit having a first load capacitance; a second output circuit having a second load capacitance; an isolation circuit that is coupled between the first output terminal of the CMOS sense amplifier and the first output circuit and that is coupled between the second output terminal of the CMOS sense amplifier and the second output terminal of the CMOS sense amplifier, wherein the isolation circuit isolates the first and second load capacitances from the CMOS sense amplifier; and a decision feedback equalizer (DFE) that is coupled to the ADC.

In accordance with an embodiment of the present invention, an apparatus is provided. The apparatus comprises a serializer; a transmitter that is coupled to the serializer; a communication medium that is coupled to the transmitter; a receiver having: an AFE; an ADC that is coupled to the AFE, wherein the ADC has a plurality of slicers, and wherein each slicer includes: a sense amplifier having: a first supply rail; a second supply rail; a first output terminal; a second output terminal; a pair of cross-coupled PMOS transistors that are each coupled to the first and second output terminals and to the first supply rail; a pair of cross-coupled NMOS transistors that are each coupled to the first and second output terminals; a differential input pair of NMOS transistors that are each coupled to the communication channel and the pair of cross-coupled NMOS transistors; a first clocking NMOS transistor that is coupled between the first supply rail and the first output terminal and that is configured to receive a clock signal; a second clocking NMOS transistor that is coupled between the first supply rail and the second output terminal and that is configured to receive the clock signal; and a third clocking NMOS transistor that is coupled between the differential input pair of NMOS transistors and the second supply rail and that is configured to receive the clock signal; a first output circuit having a first load capacitance; a second output circuit having a second load capacitance; an isolation circuit that is coupled between the first output terminal of the sense amplifier and the first output circuit and that is coupled between the second output terminal of the sense amplifier and the second output terminal of the sense amplifier, wherein the isolation circuit isolates the first and second load capacitances from the sense amplifier; and a DFE that is coupled to the ADC; and a deserializer that is coupled to the DFE.

In accordance with an embodiment of the present invention, the isolation circuit further comprises: a precharge circuit that is coupled to the first and second inverters and that is controlled by the clock signal; and a first isolation element that is coupled between the first output terminal of the sense amplifier and the first inverter; and a second isolation element that is coupled between the second output terminal of the sense amplifier and the second inverter.

In accordance with an embodiment of the present invention, the precharge circuit further comprises: a first precharge PMOS transistor that is coupled to the first inverter at its drain; and a second precharge PMOS transistor that is coupled to the second inverter at its drain.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
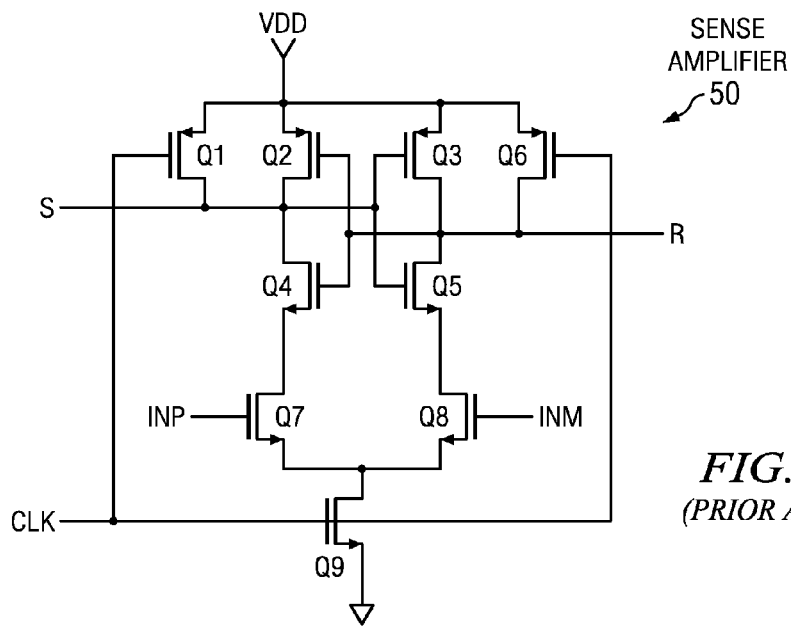
FIG. 1 is a diagram of an example of a conventional CMOS sense amplifier.

Refer now to the drawings wherein depicted elements are, for the sake of clarity, not necessarily shown to scale and wherein like or similar elements are designated by the same reference numeral through the several views.

Figure 2:
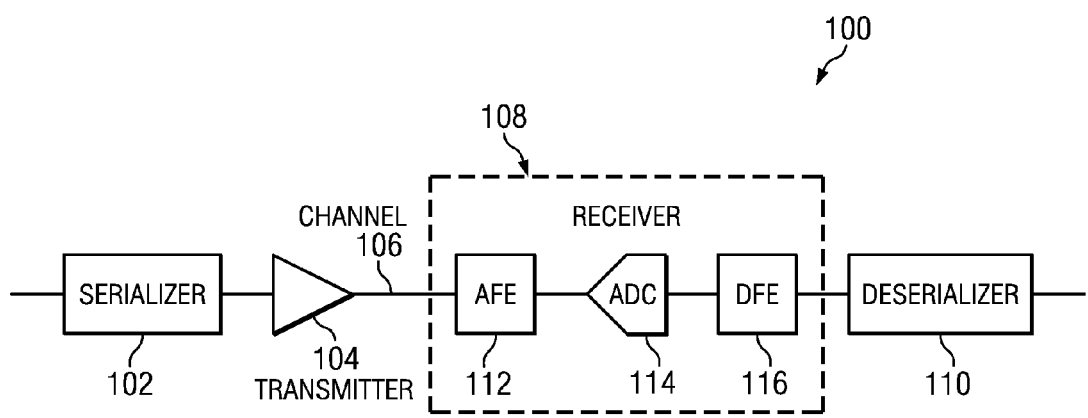
FIG. 2 is a diagram of an example of a system in accordance with an embodiment of the present invention.

As mentioned above, it is desirable in some applications to reduce the propagation delay $T_{PROP}$. This can be accomplished through adjustment of time constant $\tau$. An example of such an application would be a sense amplifier based slicer in a serializer/deserializer (SERDES) system 100, which can be seen in FIGS. 2 and 3. In operation, the serializer 102 converts parallelized streams of data into a serial data stream. This serialized data is then transmitted by transmitter 104 over channel 106 (which is generally a communication medium, like a twisted pair) to receiver 108. The analog front end (AFE) 112 of receiver 108 is then able to recover the signal from the channel 106, which is then digitized by ADC 114 (which generally employs slicers 202-1 to 202-N and which can be several ADCs). The DFE 116 then filters and equalizes the digitized signal (i.e., compensates for inter-symbol interference or ISI), and the deserializer 110 parallelizes the output from the DFE 116. Within this system 100, it is the slicers 202-1 to 202-N, which use a sense amplifier based comparator that can benefit from adjustment of time constant $\tau$.

Turning back to FIG. 1, the time constant $\tau$ is related to capacitance. Specifically, this time constant $\tau$ is proportional to a load capacitance $C_{LOAD}$ divided by the transconductance $g_m$ of the transistors Q2 through Q5 (i.e., $\tau \alpha C_{LOAD}/g_m$). This load capacitance $C_{LOAD}$ is typically the sum of the intrinsic or internal capacitance $C_{INT}$ of sense amplifier 50 and an external capacitance $C_{EXT}$ on terminals R and S. To reduce the time constant $\tau$, the load capacitance $C_{LOAD}$ should be reduced, while increasing the transconductance $g_m$. Increasing the transconductance $g_m$ would mean that the transistors Q1 to Q9 should be increased in size, but the increase in size is limited as internal capacitance $C_{INT}$ is proportional to the sizes of transistors Q1 to Q9. Thus, merely increasing the sizes of transistors Q1 to Q9 would not achieve the desired effect, so the slicers 202-1 to 202-N employ sense amplifier based comparators where the external capacitance $C_{EXT}$ is decoupled or isolated from the internal capacitance $C_{INT}$ so that load capacitance $C_{LOAD}$ is approximately equal to the internal capacitance $C_{INT}$.

Figures 3, 4:
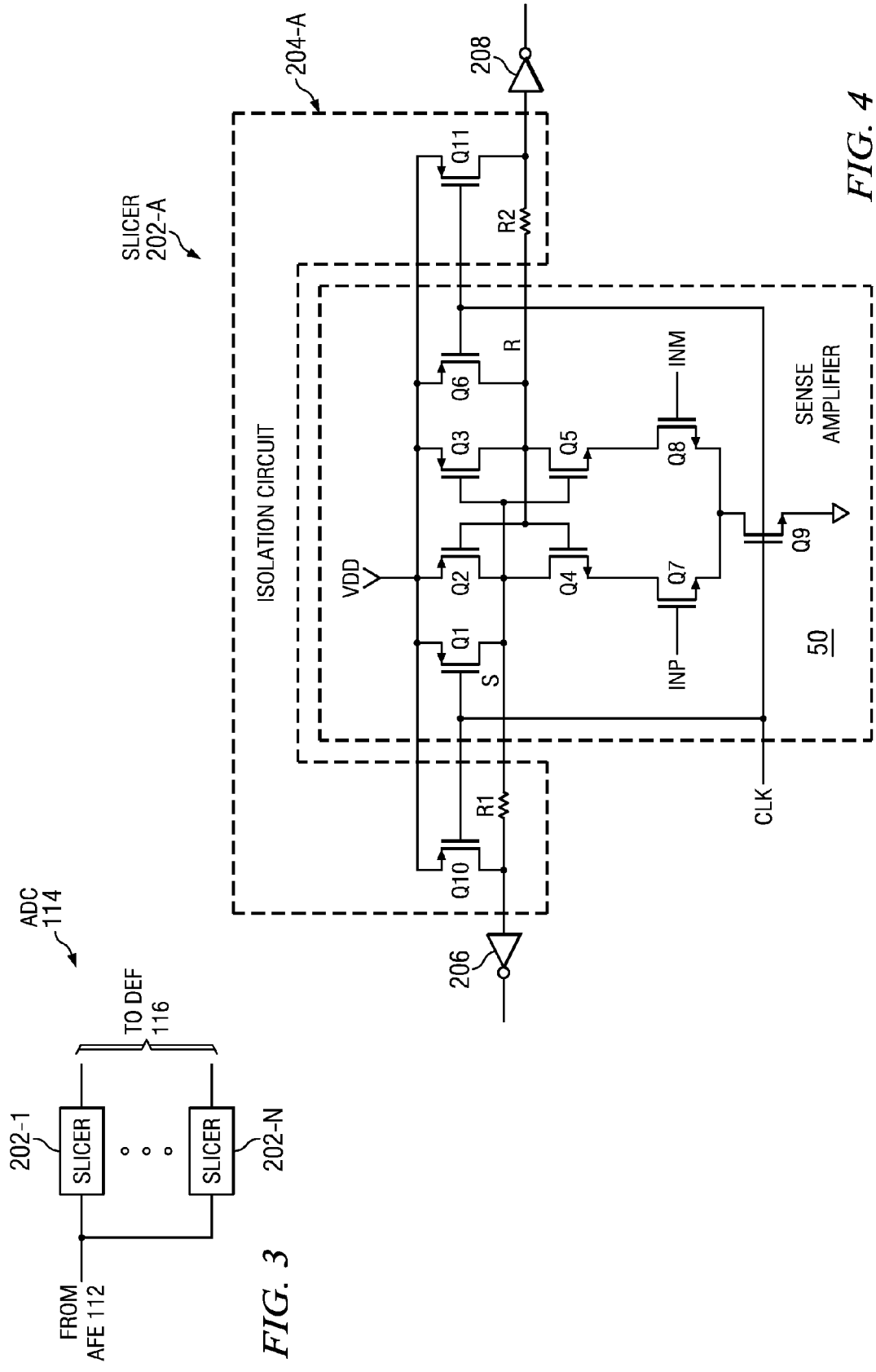
FIG. 3 is a diagram of an example of at least a portion of the ADC of FIG. 2.
FIGS. 4 and 5 are diagrams of examples of a slicer of FIG. 3.

An example of such a slicer 202-1 to 202-N (which is labeled 202-A) can be seen in FIG. 4. As shown in this example, the external capacitance $C_{EXT}$ results from the loading of the output circuits (which are generally comprised of inverters 206 and 208 in this example). An isolation circuit 204-A is coupled between terminals R and S and inverters 206 and 208. This isolation circuit 204-A is generally comprised of a precharge circuit (i.e., PMOS transistors Q10 and Q11) and resistors R1 and R2. The precharge circuit (which is controlled by clock signal CLK) is generally used to precharge the external capacitance $C_{EXT}$ provided by inverters 206 and 208, and the resistors R1 and R2 (which function as isolation elements) isolate the external capacitance $C_{EXT}$ from the internal capacitance $C_{INT}$. Additionally, because transistors Q10 and Q11 provide the precharging for the external capacitance $C_{EXT}$, transistors Q1 and Q6 can be reduced in drive strength (i.e., size), which reduces the internal capacitance $C_{INT}$ and further reduces time constant τ.

Figure 6:
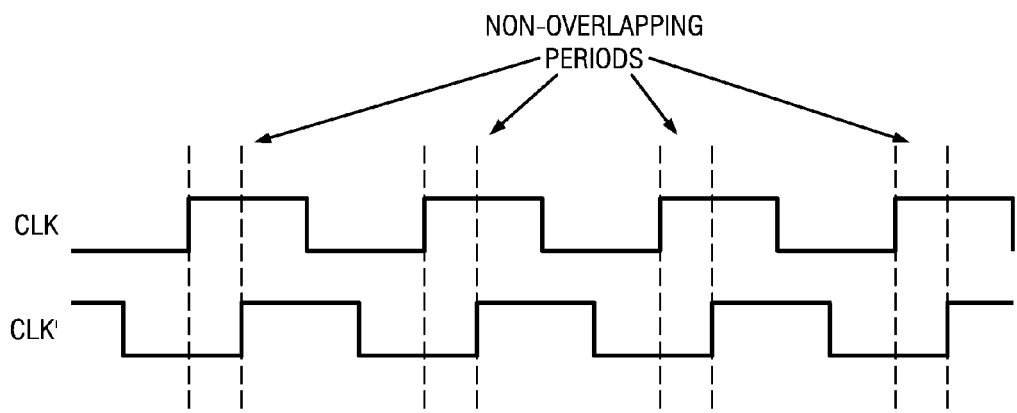
FIG. 6 is an example of a timing diagram for the slicer of FIG. 5.
Figure 5:
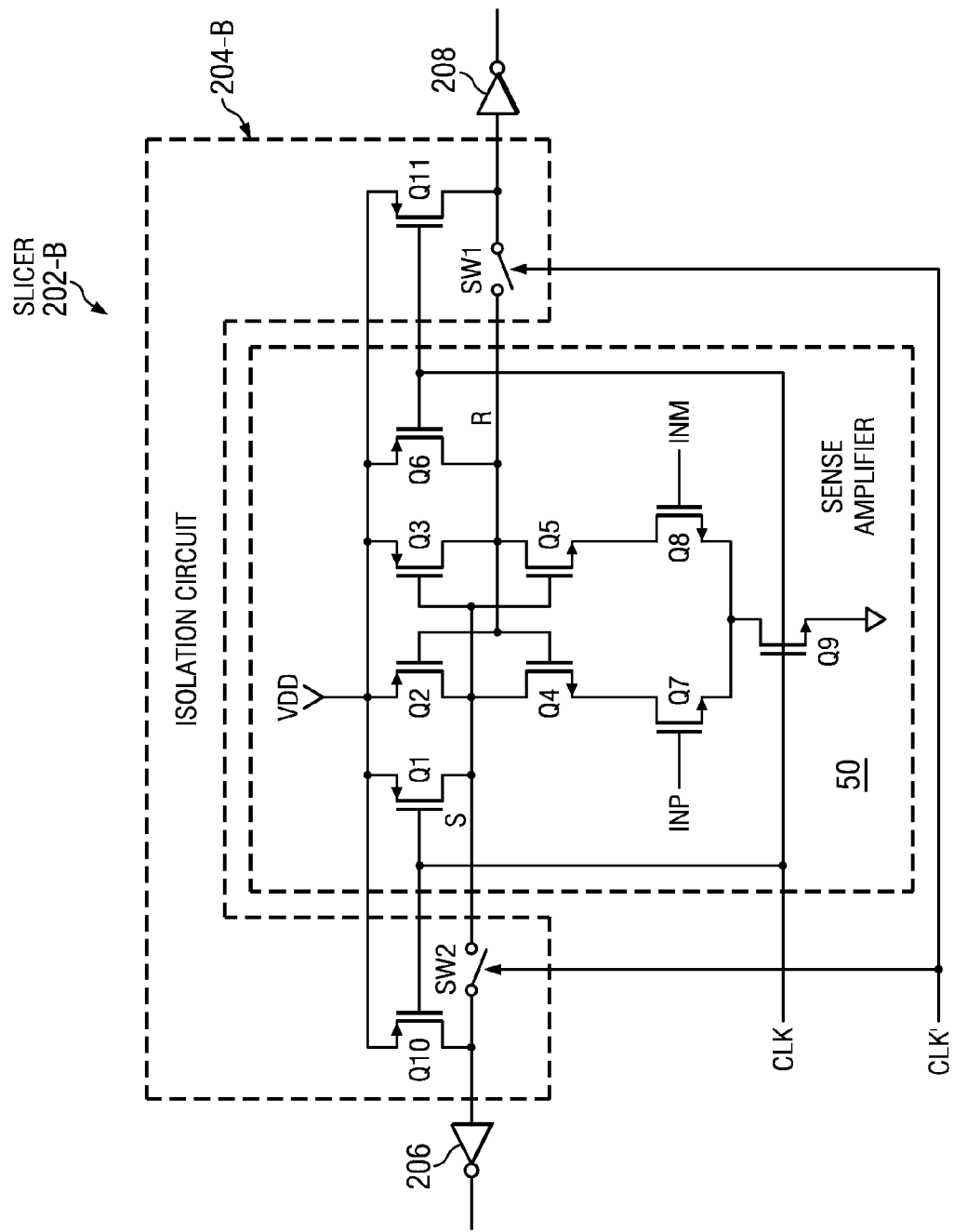

In FIG. 5, another example of a slicer 202-1 to 202-N (which is labeled 202-B) is shown. Slicer 202-B is similar to the slicer 202-A, except that isolation circuit 204-A has been replaced with isolation circuit 204-B. In isolation circuit 204-B, switches SW1 and SW2 are employed as the isolation elements. These switches SW1 and SW2 are controlled by clock signal CLK'. As shown in FIG. 6, clock signal CLK' is generated such that there is a non-overlapping period between activation of the sense amplifier 50 by the clock signal CLK and activation of switches SW1 and SW2 by the clock signal CLK'. During these non-overlapping periods, the external capacitance CEXT is isolated, allowing the time constant τ to be set by the internal capacitance $C_{INT}$. It is at a point later (once the sense amplifier 50 has resolved the values on terminals R and S) that the output circuits (i.e., inverters 206 and 208) are coupled to the terminals R and S.

As a result of implementing these slicers 202-1 to 202-N, several advantages can be realized. First, the shortened propagation delay allows the slicers 202-1 to 202-N to operate at a higher speed (i.e., clock frequency CLK is higher). Second, comparator metastability can be reduced, and, third, the bit error rate (BER) of ADC 114 and the overall transceiver system is improved.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a CMOS sense amplifier having a first input terminal, a second input terminal, a first output terminal, and a second output terminal;
a first output circuit having a first load capacitance;
a second output circuit having a second load capacitance; and
an isolation circuit that is coupled between the first output terminal of the CMOS sense amplifier and the first output circuit and that is coupled between the second output terminal of the CMOS sense amplifier and the second output terminal of the CMOS sense amplifier, wherein the isolation circuit isolates the first and second load capacitances from the CMOS sense amplifier,
wherein the CMOS sense amplifier is controlled by a clock signal, and wherein the isolation circuit further comprises:
a plurality of precharge circuit that are each coupled to the first and second load capacitances, respectively, and that are controlled by the clock signal; wherein
a.) the gates of the precharge circuits are coupled together, and
b.) the sources of the precharge circuits are not shorted through
an intermediate switch also driven by the clock signal;
a first isolation element that is coupled between the first output terminal of the CMOS sense amplifier and the first inverter; and
a second isolation element that is coupled between the second output terminal of the CMOS sense amplifier and the second inverter.

2. The apparatus of claim 1, wherein the first and second output circuits further comprise first and second inverters, respectively.

3. The apparatus of claim 1, wherein the precharge circuit further comprises:
a first MOS transistor that is coupled to the first inverter at its drain; and
a second MOS transistor that is coupled to the second inverter at its drain.

4. The apparatus of claim 3, wherein the first and second isolation elements further comprise first and second resistors, respectively.

5. The apparatus of claim 3, wherein the clock signal further comprises a first clock signal, and wherein the first and second isolation elements further comprise first and second switches, respectively, that are controlled by a second clock signal, and wherein there is a non-overlapping period between activation of the CMOS sense amplifier by the clock signal and activation of the first and second switches by the second clock signal.

6. The apparatus of claim 3, wherein the sense amplifier further comprises:
a clocking circuit that is configured to receive the first clock signal;
a differential input pair of transistors that is configured to receive a differential input signal;
a first pair of cross-coupled transistors that is coupled to the differential input pair of transistors; and
a second pair of cross-coupled transistors that is coupled to the first pair of cross-coupled transistors.

7. An apparatus comprising:
an analog front end (AFE);
an analog-to-digital converter (ADC) that is coupled to the AFE, wherein the ADC has a plurality of slicers, and wherein each slicer includes:
a CMOS sense amplifier having a first input terminal, a second input terminal, a first output terminal, and a second output terminal;
a first output circuit having a first load capacitance;
a second output circuit having a second load capacitance;
an isolation circuit that is coupled between the first output terminal of the CMOS sense amplifier and the first output circuit and that is coupled between the second output terminal of the CMOS sense amplifier and the second output terminal of the CMOS sense amplifier, wherein the isolation circuit isolates the first and second load capacitances from the CMOS sense amplifier,
wherein the CMOS sense amplifier is controlled by a clock signal, and wherein the isolation circuit further comprises:
a plurality of precharge circuits that are each coupled to the first and second load capacitances, respectively, and that are controlled by the clock signal; wherein
a.) the gates of the precharge circuits are coupled together, and
b.) the sources of the precharge circuits are not shorted through
an intermediate switch also driven by the clock signal;
a first isolation element that is coupled between the first output terminal of the CMOS sense amplifier and the first inverter; and
a second isolation element that is coupled between the second output terminal of the CMOS sense amplifier and the second inverter, and
a decision feedback equalizer (DFE) that is coupled to the ADC.

8. The apparatus of claim 7, wherein the first and second output circuits further comprise first and second inverters, respectively.

9. The apparatus of claim 7, wherein the precharge circuit further comprises:
   a first MOS transistor that is coupled to the first inverter at its drain; and
   a second MOS transistor that is coupled to the second inverter at its drain.

10. The apparatus of claim 9, wherein the first and second isolation elements further comprise first and second resistors, respectively.

11. The apparatus of claim 9, wherein the clock signal further comprises a first clock signal, and wherein the first and second isolation elements further comprise first and second switches, respectively, that are controlled by a second clock signal, and wherein there is a non-overlapping period between activation of the CMOS sense amplifier by the clock signal and activation of the first and second switches by the second clock signal.

12. The apparatus of claim 9, wherein the sense amplifier further comprises:
   a clocking circuit that is configured to receive the first clock signal;
   a differential input pair of transistors that is configured to receive a differential input signal;
   a first pair of cross-coupled transistors that is coupled to the differential input pair of transistors; and
   a second pair of cross-coupled transistors that is coupled to the first pair of cross-coupled transistors.

13. An apparatus comprising:
   a serializer;
   a transmitter that is coupled to the serializer;
   a communication medium that is coupled to the transmitter;
   a receiver having:
   an AFE;
   an ADC that is coupled to the AFE, wherein the ADC has a plurality of slicers, and wherein each slicer includes:
   a sense amplifier having:
   a first supply rail;
   a second supply rail;
      a first output terminal;
      a second output terminal;
   a pair of cross-coupled PMOS transistors that are each coupled to the first and second output terminals and to the first supply rail; wherein
      a) the gates of each of the pair of the cross-coupled PMOS transistors are coupled together, and
      b) the sources of each of the pair of the cross-coupled PMOS transistors are not shorted through an intermediate switch driven by a clock signal;
   a pair of cross-coupled NMOS transistors that are each coupled to the first and second output terminals;
   a differential input pair of NMOS transistors that are each coupled to the communication channel and the pair of cross-coupled NMOS transistors;
   a first clocking NMOS transistor that is coupled between the first supply rail and the first output terminal and that is configured to receive the clock signal;
   a second clocking NMOS transistor that is coupled between the first supply rail and the second output terminal and that is configured to receive the clock signal; and
   a third clocking NMOS transistor that is coupled between the differential input pair of NMOS transistors and the second supply rail and that is configured to receive the second clock signal;
   a first output circuit having a first load capacitance;
   a second output circuit having a second load capacitance;
   an isolation circuit that is coupled between the first output terminal of the sense amplifier and the first output circuit and that is coupled between the second output terminal of the sense amplifier and the second output terminal of the sense amplifier, wherein the isolation circuit isolates the first and second load capacitances from the sense amplifier;
   and
   a DFE that is coupled to the ADC; and
   a deserializer that is coupled to the DFE.

14. The apparatus of claim 13, wherein the first and second output circuits further comprise first and second inverters, respectively.

15. The apparatus of claim 13, wherein the precharge circuit further comprises:
   a first precharge PMOS transistor that is coupled to the first inverter at its drain; and
   a second precharge PMOS transistor that is coupled to the second inverter at its drain.

16. The apparatus of claim 15, wherein the first and second isolation elements further comprise first and second resistors, respectively.

17. The apparatus of claim 15, wherein the clock signal further comprises a first clock signal, and wherein the first and second isolation elements further comprise first and second switches, respectively, that are controlled by a second clock signal, and wherein there is a non-overlapping period between activation of the sense amplifier by the clock signal and activation of the first and second switches by the second clock signal.

* * * * *